United States Patent
Delahaye et al.

(10) Patent No.: US 8,668,840 B2
(45) Date of Patent: Mar. 11, 2014

(54) SOLUTION USED IN THE FABRICATION OF A POROUS SEMICONDUCTOR MATERIAL, AND A METHOD OF FABRICATING SAID MATERIAL

(75) Inventors: Bruno Delahaye, Egly (FR); Jean-Luc Baltzinger, Draveil (FR); Malamine Sanogo, Evry (FR); Gaëlle Richou, Etampes (FR)

(73) Assignee: ALTIS Semiconductor, Corbeil Essonne (FR)

( * ) Notice: Subject to any disclaimer, the term of this patent is extended or adjusted under 35 U.S.C. 154(b) by 751 days.

(21) Appl. No.: 12/082,234

(22) Filed: Apr. 9, 2008

(65) Prior Publication Data
US 2008/0268652 A1 Oct. 30, 2008

(30) Foreign Application Priority Data
Apr. 13, 2007 (FR) ...................... 07 54443

(51) Int. Cl.
*C09K 13/08* (2006.01)
(52) U.S. Cl.
USPC ....................................... 252/79.3
(58) Field of Classification Search
USPC ...................... 252/79.1, 79.2, 79.3
See application file for complete search history.

(56) References Cited

U.S. PATENT DOCUMENTS

| | | | | |
|---|---|---|---|---|
| 2,614,913 | A * | 10/1952 | Reindl et al. | 252/79.3 |
| 3,436,259 | A | 4/1969 | Regh et al. | 438/692 |
| 4,230,523 | A | 10/1980 | Gajda | 438/756 |
| 2001/0023986 | A1 * | 9/2001 | Mancevski | 257/741 |
| 2002/0166572 | A1 | 11/2002 | Chen | 134/3 |
| 2005/0218372 | A1 * | 10/2005 | Brask et al. | 252/79.1 |

FOREIGN PATENT DOCUMENTS

| | | | | |
|---|---|---|---|---|
| GB | 1570041 | 5/1977 | | C23F 7/14 |
| WO | 2007083152 | 7/2007 | | H01L 21/306 |

OTHER PUBLICATIONS

French Search Report dated Dec. 5, 2007.

* cited by examiner

*Primary Examiner* — Roberts Culbert
(74) *Attorney, Agent, or Firm* — Sofer & Haroun, LLP

(57) ABSTRACT

A solution includes hydrofluoric acid, an alcohol, and a metallic salt, in which the metal has a redox potential that is positive relative to a hydrogen electrode at 25° C.

12 Claims, No Drawings

SOLUTION USED IN THE FABRICATION OF A POROUS SEMICONDUCTOR MATERIAL, AND A METHOD OF FABRICATING SAID MATERIAL

RELATED APPLICATION

This application claims the benefit of priority from French Patent Application No. 07 54443, filed on Apr. 13, 2007, the entirety of which is incorporated herein by reference.

FIELD OF THE INVENTION

The present invention relates to a solution used in the fabrication of a porous semiconductor material, and to a method of fabricating said material.

BACKGROUND OF THE INVENTION

The invention applies typically but not exclusively to fabricating porous semiconductor materials used in the field of photovoltaic cells, optoelectronic cells, and chemical or biochemical sensors.

Document US 2002/0119663 describes a so-called "electroless" solution, i.e. a solution that does not require the use of an electric current between two electrodes, for the purpose of fabricating a porous semiconductor material.

That solution comprises a fluoride complex, said complex being prepared by dissolving a metallic element in hydrofluoric acid.

The metallic element is typically selected from: titanium (Ti); manganese (Mn); iron (Fe); zirconium (Zr); and hafnium (Hf); and it presents a redox potential that is negative relative to a hydrogen electrode at 25° C.

The method of fabricating a porous semiconductor material according to that document consists in putting the surface of a silicon type semiconductor material into contact with the solution containing the fluoride complex in order to form pores in the surface of said material.

Nevertheless, that method presents the drawback of presenting very slow reaction kinetics in order to form said porous material.

The reaction kinetics for forming pores to a depth of about 150 nanometers (nm) from the surface of the silicon material is not less than half a day, and more particularly 18 hours (h).

That type of method is thus difficult to apply on an industrial scale.

The technical problem to be solved by the subject matter of the present invention is to propose a novel solution enabling the problems of the state of the art to be avoided, in particular by offering a solution that enables a porous semiconductor material to be fabricated in a manner that is simple, fast, and inexpensive.

OBJECTS AND SUMMARY OF THE INVENTION

According to the present invention, the solution to the technical problem posed lies in that the solution comprises: hydrofluoric acid; an alcohol; and a metallic salt in which the metal has a redox potential that is positive relative to a hydrogen electrode at 25° C.

Advantageously, the pores formed with the help of said solution in the surface of the semiconductor material are of the anisotropic type.

The anisotropic effect of the solution thus enables pores to be obtained, or in other words holes in the form of cylindrical tubes, that are uniform in their dimensions and unidirectional.

In addition, the reaction kinetics with which the pores are formed and the depth of said pores can easily be controlled and optimized by varying at least one parameter selected from:

the temperature of the solution;
the concentration of the hydrofluoric acid;
the concentration of the alcohol;
the concentration of the metal;
the type of alcohol used; and
the redox potential of the metal.

In addition, said solution is very simple and fast to prepare and does not require a prior dissolution step.

Finally, the solution presents very good stability over time and is easily conserved.

In a particular implementation, the alcohol has viscosity greater than 1 centipoise (cP) at 25° C., preferably greater than 5 cP at 25° C., more preferably greater than 10 cP at 25° C.

In another particular implementation, the alcohol is a diol, and preferably the diol is ethylene glycol.

According to a characteristic of the invention, the anion of the metallic salt may advantageously be selected from $NO_3^-$ and $SO_4^{2-}$.

According to another characteristic of the invention, the metal of the metallic salt is selected from: copper (Cu), platinum (Pt), silver (Ag), and gold (Au), and is preferably copper.

More particularly, copper is the preferred metal since it is the least expensive.

The redox potentials of these preferred metals are specified in Table 1.

These potentials are as established relative to a hydrogen electrode at 25° C.

TABLE 1

| Metal | Potential (V) |
| --- | --- |
| Copper | +0.34 |
| Silver | +0.80 |
| Platinum | +1.2 |
| Gold | +1.5 |

In another particular implementation, the molar ratio of hydrofluoric acid to alcohol is equal to 4:100.

In another particular implementation, the solution includes at least 1 parts per million (ppm) of metal.

From this concentration, the number of holes and their depth increases significantly.

The present invention also provides a method of fabricating a porous semiconductor material comprising putting the surface of a semiconductor material into contact with a solution in accordance with the invention.

Advantageously, an electrolytic current becomes established in the solution as the electrochemical reaction (redox reaction) takes place between the silicon and the metal of the metallic salt.

More particularly, this electrolytic current is thus generated in situ between firstly the metal (cation) of the metallic salt acting as a cathode type electrode, and secondly the semiconductor material acting as an anode type electrode.

Furthermore, the method makes it possible to obtain pores in the surface of the semiconductor material that are uniform and anisotropic.

Preferably, the semiconductor material is immersed in said solution.

In a preferred implementation, the solution may be heated and/or exposed under white light so as to accelerate the kinetics with which the pores are formed.

More particularly, the solution may be heated, preferably to a temperature greater than 40° C.

According to a preferred characteristic of the invention, the semiconductor material is crystalline (monocrystalline or polycrystalline) silicon, and monocrystalline silicon.

MORE DETAILED DESCRIPTION

In a variant, the crystalline silicon may be p-doped and/or n-doped silicon. Thus, the reaction kinetics with which pores are formed and the depth of said pores can also be controlled and optimized easily by varying the concentration of dopant elements in the crystalline silicon.

When the crystalline silicon is n-doped, it is preferred for the solution to be exposed under white light in order to accelerate the kinetics with which pores are formed.

Typically, p-type doping is performed using boron, and n-type doping is performed using phosphorous.

The semiconductor material is preferably in the form of a wafer. One of the faces of said wafer may advantageously be covered in an outer layer of an organic or inorganic dielectric material.

The presence of such an outer dielectric layer serves to increase the density and/or the depth of the pores.

In another particularly preferred implementation, the method further comprises a step of cleaning the porous semiconductor material with the help of an oxidizing composition.

The oxidizing composition advantageously serves to eliminate all deposition of metal that might occur at the surface of the semiconductor material while the pores are being formed.

The semiconductor material may be contaminated by metal being deposited in a hydrofluoric acid medium and in the presence of the metallic salt.

By way of example, when the material is silicon and is put into contact with a copper salt in a hydrofluoric acid medium, the following electrochemical reactions take place:

$$Si+6HF \rightarrow H_2SiF_6+4H^++4e^-$$

$$2H^++2e^- \rightarrow H_2$$

$$Cu^{2+}+2e^- \rightarrow Cu(\text{metal deposition})$$

It is thus preferable with the help of an oxidizing composition to eliminate the deposit of metallic copper formed on the surface of the silicon material in order to copper diffusing into the silicon and degrading it.

The oxidizing composition is preferably selected from SC1, SC2, and SPM.

SC1 compositions (Solution Clean No. 1) comprise ultrapure deionized water, oxygenated water, and ammonium hydroxide.

For example, the composition by volume of the SC1 may be 5:1:1 ($H_2O:H_2O_2:NH_4OH$) or it may be 80:3.1:1.3 ($H_2O:H_2O_2:NH_4OH$).

The SC2 composition (Solution Clean No. 2) is made up of ultrapure deionized water, oxygenated water, and hydrochloric acid.

For example, the composition by volume of the SC2 may be 5:1:1 ($H_2O:H_2O_2:HCl$) or 80:3.1:2.2 ($H_2O:H_2O_2:HCl$).

The SPM composition (Sulfuric Peroxide Mixture) is made up of oxygenated water and sulfuric acid.

For example, the composition by volume of the SCM may be 4:1 ($H_2SO_4:H_2O_2$).

Naturally, the step of cleaning the porous semiconductor material may comprise using a plurality of oxidizing compositions in succession.

After the semiconductor material has been put into contact with the solution of the present invention, the resulting porous semiconductor material can thus be cleaned by being plunged into a bath of said oxidizing composition or merely by being sprinkled therewith.

In another particularly preferred implementation, the method does not include external electrodes conveying an electric current, such electrodes being relatively expensive.

By way of example, there is no need to add a platinum cathode type metallic electrode in the solution that might be associated with an anode of semiconductor material, the cathode and the anode conveying an electric current.

The present invention also provides the use of said solution for fabricating photovoltaic cells, optoelectronic cells, and/or chemical or biochemical sensors.

Other characteristics and advantages of the present invention appear in the light of the following example, said example being given by way of non-limiting illustration.

A solution comprising a mixture of hydrofluoric acid, ethylene glycol, and $CuSO_4$ was prepared, the ethylene glycol having viscosity of about 16 cP at 25° C.

The molar ratio of the hydrofluoric acid to the ethylene glycol was 4:100.

The quantity of metal of the metal salt $CuSO_4$ in the solution was 1 ppm.

In order to fabricate a porous semiconductor material, use was made in this example of a circular monocrystalline silicon wafer having a diameter of 200 millimeters (mm) and a thickness of 700 micrometers (μm).

The monocrystalline silicon wafer was covered on one of its faces in an outer layer of an inorganic dielectric material such as silicon nitride.

An intermediate silicon oxide layer was also present between the monocrystalline silicon wafer and the layer of silicon nitride in order to avoid mechanical stresses, well known to the person skilled in the art, between the silicon nitride and the monocrystalline silicon wafer.

Consequently, the deposition of said outer layer on the monocrystalline silicon wafer was so-called indirect deposition.

Naturally, the outer layer of organic or inorganic dielectric material could also be deposited directly on one of the faces of the monocrystalline silicon wafer, or in other words without the presence of an intermediate layer.

The other face of the monocrystalline silicon wafer, the face that was not covered in said outer layer and that was in contact with the solution, is referred to as the active face. When the silicon wafer is not covered in an outer layer, said wafer has two active faces.

The monocrystalline silicon wafer covered on one of its faces in the outer layer was then immersed for 7 minutes (min) in a thermostatic bath of said metallic solution, said solution being at a temperature of 85° C.

The wafer as obtained in that way was extracted from the thermostatic bath and rinsed in water.

That produced a porous monocrystalline silicon wafer having uniform pores over the entire surface of said wafer, or more particularly uniform pause over the entire active face of said wafer.

The pores were holes in then form of cylindrical tubes extending perpendicularly from the surface of said face (or active face), each of said holes being substantially parallel with the other holes.

The pores, formed anisotropically at the surface of said wafer, had a depth lying in the range 150 nanometers (nm) to 250 nm, and a diameter lying in the range 15 nm to 30 nm.

Naturally, it is possible to use etching masks positioned on the surface of the semiconductor material, or any other technique well known to the person skilled in the art, in order to locate pore formation in preferred manner.

The present invention is not limited to the solution and the method as described above by way of example, and it relates in general to all solutions and to all methods that can be envisaged on the basis of the general indications provided in the description of the invention.

What is claimed is:

1. A solution used in the fabrication of a porous semiconductor material, said solution comprising:
   hydrofluoric acid;
   an alcohol having viscosity greater than 5 cP at 25° C.; and
   a metallic salt in which the metal has a redox potential that is positive relative to a hydrogen electrode at 25° C., wherein said solution is formulated such that when applied to a surface of a semiconductor material constructed of silicon, an electrolytic current becomes established in said solution, as a redox reaction takes place between said metal and said silicon, such that said solution causes said surface to be porous, so that said surface has anisotropic pores.

2. The solution according to claim 1, wherein the alcohol is a diol.

3. The solution according to claim 2, wherein the alcohol is ethylene glycol.

4. The solution according to claim 2, wherein the anion of the metallic salt is selected from $NO_3^-$ and $SO_4^{2-}$.

5. The solution according to claim 1, wherein the anion of the metallic salt is selected from $NO_3^-$ and $SO_4^{2-}$.

6. The solution according to claim 1, wherein the metal of the metallic salt is selected from the group consisting of: copper, platinum, silver, and gold.

7. The solution according to claim 1, wherein the molar ratio of hydrofluoric acid to alcohol is equal to 4:100.

8. The solution according to claim 1, including at least 1 ppm of metal.

9. The solution as claimed in claim 1, wherein said solution is formulated such that when applied to a surface of a semiconductor material it causes said surface to exhibit substantially uniformly sized pores over the entire surface of semiconductor.

10. The solution as claimed in claim 1, wherein the pores are holes substantially in form of cylindrical tubes extending perpendiculary from the surface of said surface.

11. The solution as claimed in claim 1, wherein the pores have a depth lying in the range 150 nanometers to 250 nanometers.

12. The solution as claimed in claim 1, wherein the pores have a diameter lying in the range 15 nanometers to 30 nanometers.

* * * * *